(12) United States Patent
Wienrich et al.

(10) Patent No.: US 9,003,642 B2
(45) Date of Patent: Apr. 14, 2015

(54) METHOD FOR MAKING A MAGNETICALLY COUPLED THIN-WAFER HANDLING SYSTEM

(75) Inventors: Jeffrey Wienrich, Gilbert, AZ (US); Charles Singleton, Mesa, AZ (US)

(73) Assignee: Intel Corporation, Santa Clara, CA (US)

( * ) Notice: Subject to any disclaimer, the term of this patent is extended or adjusted under 35 U.S.C. 154(b) by 212 days.

(21) Appl. No.: 13/598,935

(22) Filed: Aug. 30, 2012

(65) Prior Publication Data

US 2012/0321430 A1     Dec. 20, 2012

Related U.S. Application Data

(62) Division of application No. 12/327,726, filed on Dec. 3, 2008, now Pat. No. 8,276,262.

(51) Int. Cl.
| | | |
|---|---|---|
| H01F 7/06 | (2006.01) | |
| H01L 21/683 | (2006.01) | |
| H01L 21/687 | (2006.01) | |

(52) U.S. Cl.
CPC ........ *H01L 21/683* (2013.01); *H01L 21/68721* (2013.01)

(58) Field of Classification Search
USPC .................. 29/426.1, 434, 607, 729; 118/500; 156/345.51; 414/806
See application file for complete search history.

(56) References Cited

U.S. PATENT DOCUMENTS

| | | |
|---|---|---|
| 6,893,124 B1 | 5/2005 | Kurtin |
| 7,065,860 B2 * | 6/2006 | Aoki et al. ............. 29/607 |
| 7,513,380 B2 | 4/2009 | Canedo |
| 2003/0122357 A1 | 7/2003 | Rhue |
| 2007/0170184 A1 | 7/2007 | Canedo |
| 2010/0135764 A1 | 6/2010 | Wienrich et al. |

* cited by examiner

*Primary Examiner* — Paul D Kim
(74) *Attorney, Agent, or Firm* — Winkle, PLLC

(57) ABSTRACT

The present invention describes a method of and an apparatus for including: separating magnets and corresponding target plates; separating a lower support assembly from an upper retainer assembly of a thin-wafer handling system; and inserting or removing a thin wafer from the thin-wafer handling system.

6 Claims, 2 Drawing Sheets

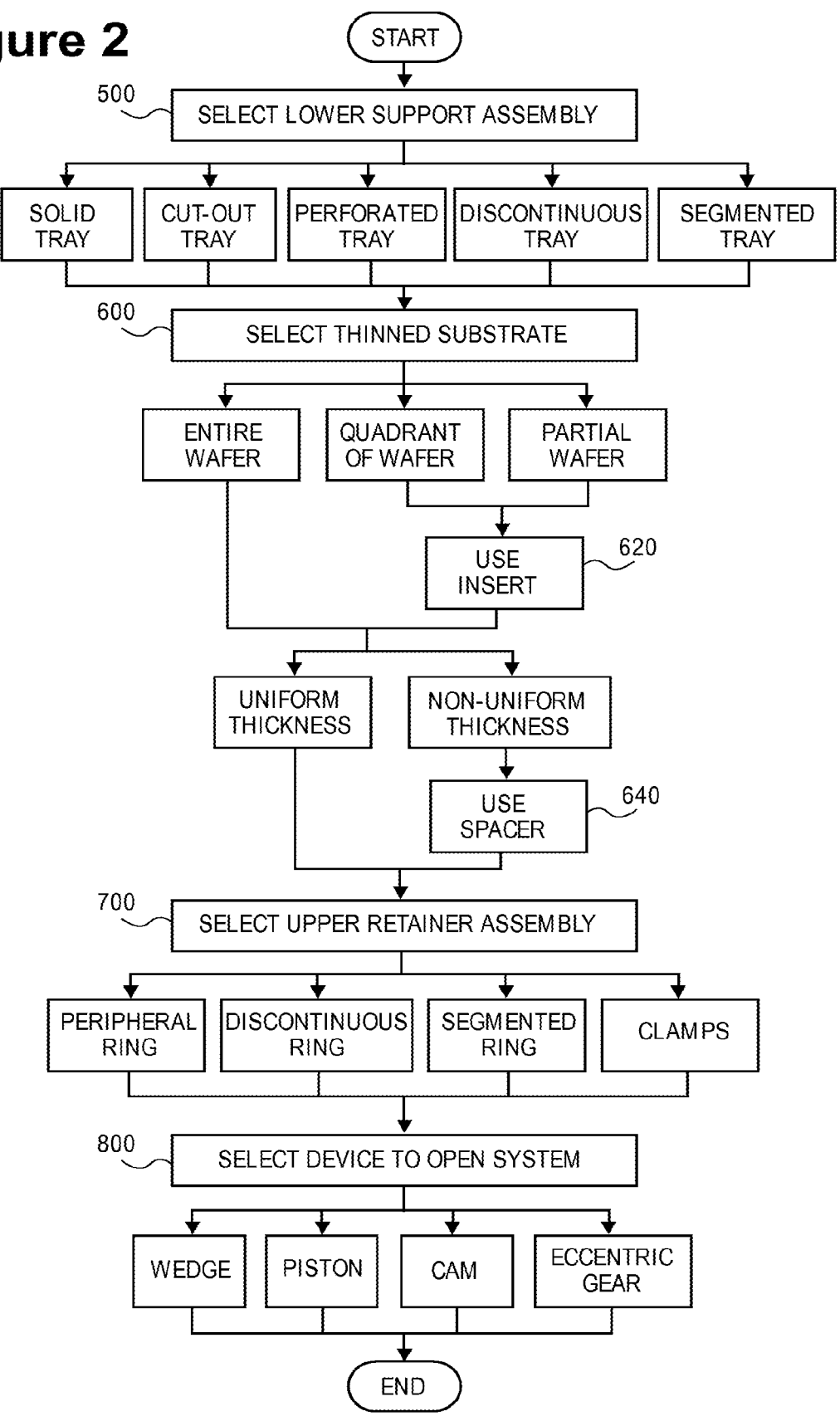

METHOD FOR MAKING A MAGNETICALLY COUPLED THIN-WAFER HANDLING SYSTEM

CROSS REFERENCE TO RELATED APPLICATION

This application is a divisional of U.S. patent application Ser. No. 12/327,726 filed Dec. 3, 2008, now U.S. Pat. No. 8,276,262.

BACKGROUND OF THE INVENTION

1. Field of the Invention

The present invention relates to a field of semiconductor integrated circuit manufacturing, and more specifically, to a method of handling a thin wafer during processing.

2. Discussion of Related Art

Gordon Moore originally observed in 1964 that technology innovation had led to a doubling of a density (number of transistors per unit area) of an integrated circuit (IC) chip approximately every 12 months. By 1975, the trend had stabilized to a doubling of the density about every 18 months. Over the ensuing decades, the semiconductor industry has adhered closely to a well-known Moore's Law in increasing the density of transistors for each generation of IC chips.

The IC chip includes a planar transistor that is formed in a substrate, such as a wafer. The wafer is made from a semiconductor material, such as silicon. During processing, a material may be added to, or removed from, the wafer. The material may include an insulator, such as silicon oxide, or a conductor, such as copper.

Additive processes that are used to form material, partially or completely, on the wafer include chemical vapor deposition, sputtering, electroplating, oxidation, and ion implantation.

Subtractive processes that are used to remove material, partially or completely, from the wafer include wet etching, dry etching, and chemical-mechanical polishing (CMP).

For many layers of material, photolithographic processes are used, in conjunction with the additive processes or the subtractive processes, to pattern portions of the wafer.

Maintaining an aggressive schedule required to comply with Moore's Law has resulted in a scaling down of a metal oxide semiconductor field effect transistor (MOSFET) that is used in a complementary metal-oxide-semiconductor (CMOS) circuit. The performance and reliability of the transistor have been improved by implementing many features such as semiconductor-on-insulator (SOI) substrate, selective epitaxially deposited (SED) raised source and drain, atomic layer deposited (ALD) high-k (dielectric constant) gate dielectric, metal gates, strained channel, and low-k interlevel dielectric (ILD) layers.

Many parameters of the IC chip are monitored during fabrication to ensure that the product specification for performance and reliability will be met even as the design rule becomes tighter. However, as the wafer size becomes larger, such as a diameter of 450 mm, challenges may arise in handling and transporting the wafer without incurring any damage. The difficulty may be aggravated for thin wafers that are required for die stacking, wafer stacking, 3-dimensional (3-D) packaging, and attaching thin flip chip die to thin and flexible substrates.

BRIEF DESCRIPTION OF THE DRAWINGS

FIG. 2 is a flowchart of a method of handling a thin wafer according to an embodiment of the present invention.

DETAILED DESCRIPTION OF THE PRESENT INVENTION

Figure 1:
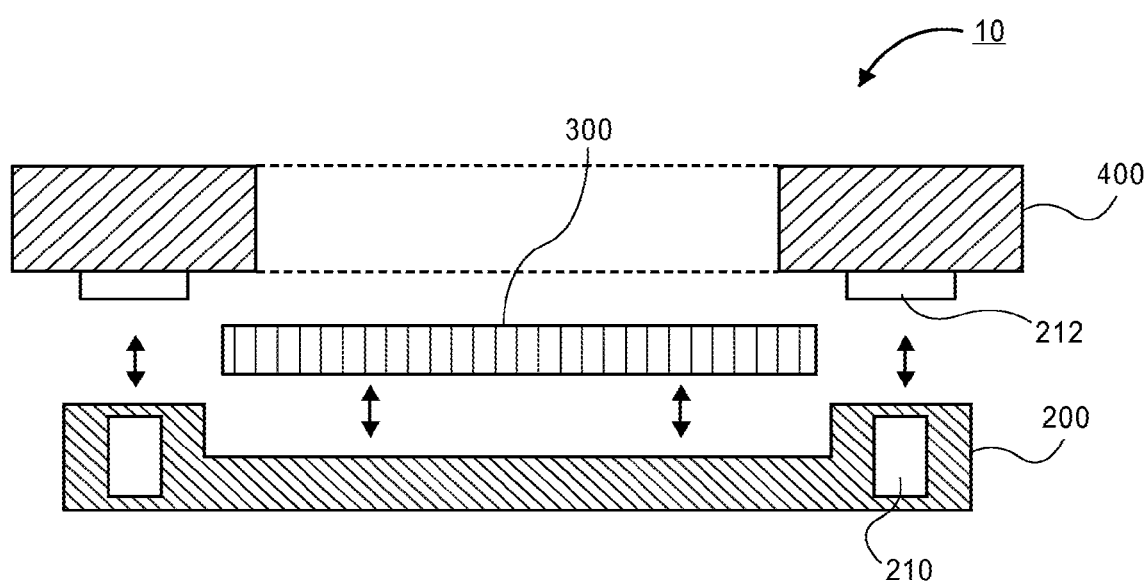
FIG. 1 is an elevation view of a thin-wafer handling system in an opened configuration according to an embodiment of the present invention.

In the following description, numerous details, such as specific materials, dimensions, and processes, are set forth in order to provide a thorough understanding of the present invention. However, one skilled in the art will realize that the invention may be practiced without these particular details. In other instances, well-known semiconductor equipment and processes have not been described in particular detail so as to avoid obscuring the present invention.

A thin-wafer handling system 10 of the present invention prevents an enclosed thin wafer 300 from accumulating damage during an on-going manufacture of an Integrated Circuit (IC) chip. The damage may be structural, mechanical, physical, or chemical. The damage may be localized to a portion of an edge, surface, or bulk of the thin wafer 300.

In particular, the thin-wafer handling system 10 prevents the enclosed thin wafer 300 from sustaining damage when stored, transported, or handled during subsequent process steps. Otherwise, damage to the thin wafer 300 may result from improper or excessive exposure, contact, shock, or vibration.

According to an embodiment of the present invention, as shown in FIG. 1, a thin-wafer handling system 10 includes a lower support assembly 200 and an upper retainer assembly 400. In an embodiment of the present invention, the thin-wafer handling system 10 may function or operate in other orientations, such as sideways, tilted, or upside-down, especially in a closed configuration.

In an embodiment of the present invention, the lower support assembly 200 is formed from a rigid and tough material. In an embodiment of the present invention, the lower support assembly 200 is formed from a non-ferromagnetic material. In an embodiment of the present invention, the lower support assembly 200 is formed from a material with a low coefficient of thermal expansion (CTE).

In an embodiment of the present invention, the lower support assembly 200 includes a solid tray to distribute a weight of a thin wafer 300 more evenly and to facilitate cleaning.

In an embodiment of the present invention, the lower support assembly 200 includes a cut-out tray or a perforated tray to reduce weight, allow airflow, or maintain a more uniform temperature during a subsequent process step.

In an embodiment of the present invention, the lower support assembly 200 includes a discontinuous tray or a segmented tray to minimize stress across the surface of the wafer. In an embodiment of the present invention, the lower support assembly 200 includes a radially segmented tray, such as a series of noncontiguous (non-butting) concentric rings.

In an embodiment of the present invention, the thin-wafer handling system 10 includes inserts (not shown) to accommodate a substrate (not shown) having an irregular size or shape, such as a quadrant of a thinned 450 mm wafer or a partial wafer.

In an embodiment of the present invention, the thin-wafer handling system 10 includes spacers (not shown) to accommodate a substrate having surface topography or non-uniform thickness.

In an embodiment of the present invention, the upper retainer assembly 400 is formed from a light and flexible material. In an embodiment of the present invention, the upper retainer assembly 400 is formed from a non-ferromagnetic material. In an embodiment of the present invention, the upper retainer assembly 400 is formed from a material with a low coefficient of thermal expansion (CTE).

In an embodiment of the present invention, the upper retainer assembly 400 includes a peripheral ring to allow minimal obscuration of the die on the wafer during a subsequent process step.

In an embodiment of the present invention, the upper retainer assembly 400 includes a discontinuous ring or a segmented ring to minimize stress on the edges of the wafer, such as when the thin wafer 300 has warpage, surface topography, or patterned surface layers.

In an embodiment of the present invention, the upper retainer assembly 400 includes clamps that either complement or substitute for the peripheral ring.

In an embodiment of the present invention, magnets 210 are embedded in the lower support assembly 200 only and corresponding target plates 212 are attached to the upper retainer assembly 400.

In an embodiment of the present invention, magnets 210 are embedded in the upper retainer assembly 400 only and corresponding target plates 212 are attached to the lower support assembly 200.

In an embodiment of the present invention, magnets 210 are embedded in both the lower support assembly 200 and the upper retainer assembly 400 with the corresponding target plates attached to the opposing side.

In an embodiment of the present invention, magnets 210 embedded in the lower support assembly 200 are facing other magnets 210 embedded in the upper retainer assembly 400.

In an embodiment of the present invention, magnets 210 are embedded to minimize damage from abrasion. In an embodiment of the present invention, magnets 210 are embedded to minimize generation of particles which may contaminate the surface of the thin wafer 300. Embedded refers to a condition of being set in a surrounding material.

However, in an embodiment of the present invention, magnets 210 are embedded to minimize attenuation of an attractive force of the magnets 210 for corresponding target plates 212.

In an embodiment of the present invention, the target plates 212 are formed from hard ferromagnetic material, such as Iron (Fe), Nickel (Ni), or Cobalt (Co). Corresponding refers to a state of alignment (in x-, y-, and z-axes) whereby target plates 212 are facing magnets 210 that attract them to come into contact.

In an embodiment of the present invention, the magnets 210 are surrounded laterally (in the plane of x-axis and y-axis) by magnetic shields that are formed from a material with high magnetic permeability.

In an embodiment of the present invention, the magnets 210 have a shape that conforms to a shape of the lower support assembly 200 or the upper retainer assembly 400. In an embodiment of the present invention, the magnets 210 have a shape of a flat solid block or a curved solid block (an arcuate shape). In an embodiment of the present invention, the magnets 210 have a shape of a flat round disc or a long round rod. In an embodiment of the present invention, the magnets 210 have a shape of a flat hollow ring or a long hollow cylinder.

In an embodiment of the present invention, the magnets 210 are permanent magnets that retain their magnetism indefinitely. In an embodiment of the present invention, the magnets 210 are formed from an alloy of rare-earth material. In an embodiment of the present invention, the magnets 210 are formed from elements in the Lanthanide group, such as Neodymium or Samarium. In an embodiment of the present invention, the magnets 210 are Neodymium-Iron-Boron magnets, such as $Nd_2Fe_{14}B$. In an embodiment of the present invention, the magnets 210 are Samarium Cobalt magnets, such as $SmCo_5$ or $Sm_2Co_{17}$.

In an embodiment of the present invention, the magnets 210 are formed by sintering which includes compacting fine alloy powder and fusing with heat at a high temperature. Rare-earth magnets are brittle so they break and chip easily. Rare-earth magnets are also susceptible to corrosion and oxidation. In an embodiment of the present invention, the magnets 210 are electroplated with Nickel-Copper-Nickel (Ni—Cu—Ni) to improve durability. In an embodiment of the present invention, the magnets 210 are further electroplated with Tin (Sn), Zinc (Zn), Silver (Ag), or Gold (Au).

In an embodiment of the present invention, the magnets 210 are formed by bonding which includes mixing alloy powder with a polymer base. In an embodiment of the present invention, the magnets 210 are coated with epoxy resin.

In an embodiment of the present invention, the magnets 210 formed from an alloy of rare-earth material produce a high magnetic field. In an embodiment of the present invention, the magnets 210 have a maximum energy product (BH) of 16-32 MGOe or million Gauss Oerstedts for SmCo magnets or 35-52 MGOe for NdFeB magnets.

In an embodiment of the present invention, the magnets 210 may start becoming demagnetized upon heating despite not reaching a Curie temperature. In an embodiment of the present invention, the maximum operating temperature is 80-200 degrees Centigrade for NdFeB magnets or 180-350 degrees Centigrade for SmCo magnets.

In an embodiment of the present invention, the lower support assembly 200 and the upper retainer assembly 400 of the thin-wafer handling system 10 are electrically grounded. Otherwise, SmCo magnets have a low ignition point so a spark from static electricity may start a fire.

In an embodiment of the present invention, the thin-wafer handling system 10 includes electromagnets instead of the magnets 210. However, in an embodiment of the present invention, electrical power must be continuously applied to the electromagnets to maintain an attraction to the corresponding target plates 212.

In an embodiment of the present invention, the thin-wafer handling system 10 includes bi-stable linear actuators instead of the magnets 210 so a separate device to open the apparatus is not needed. In an embodiment of the present invention, a permanent magnet holds an armature (plunger) in a latched position ("in") without need to continuously apply power to a coil of a solenoid. When needed, a very small pulse of reverse electrical current is applied to the coil of the solenoid to disrupt a holding force of the permanent magnet just enough to allow a small internal spring that is compressed to return the armature linearly to an unlatched position (plunger "out"). The bi-stable linear actuator can remain indefinitely in either the "in" or the "out" position. No power is consumed while maintaining either the latched ("in") position or the unlatched ("out") position. Thus, a battery may be used to provide a brief burst of power as needed. Furthermore, very little heat is generated by each burst of power.

Next, a method of handling the thin wafer 300 according to an embodiment of the present invention as shown in FIG. 2 will be described.

In an embodiment of the present invention, the thin wafer 300 is formed from an elemental semiconductor, such as silicon. In an embodiment of the present invention, the thin wafer 300 is formed from a compound semiconductor, such as silicon germanium (SiGe) or gallium arsenide (GaAs).

In an embodiment of the present invention, the thin wafer 300 is formed by thinning a backside of a circular and flat wafer. In an embodiment of the present invention, the wafer has a diameter of 150 (+/−0.2) mm and a thickness of 675 (+/−15) microns (um). In an embodiment of the present invention, the wafer has a diameter of 200 (+/−0.2) mm and a thickness of 725 (+/−15) microns (um). In an embodiment of the present invention, the wafer has a diameter of 300 (+/−0.2) mm and a thickness of 775 (+/−25) um. In an embodiment of the present invention, the wafer has a diameter of 450 mm and a thickness selected from a range of 700-1,300 um. In an embodiment of the present invention, the wafer has a diameter of 450 mm and a thickness selected from a range of 825-925 um. In some situations, the wafer is thicker than described above so as to accommodate strips, cleans, etches, and reworks.

In an embodiment of the present invention, the backside of the wafer is thinned by lapping and polishing. In an embodiment of the present invention, the thin wafer 300 has a thickness of 75-125 um after thinning down the backside. In an embodiment of the present invention, the thin wafer 300 has a thickness of 25-75 um after thinning down the backside. In an embodiment of the present invention, the thin wafer 300 has a thickness of 10-25 um after thinning down the backside.

First, a lower support assembly is selected (block 500). Some choices include a solid tray, a cut-out tray, a perforated tray, a discontinuous tray, and a segmented tray.

Second, a thinned substrate is selected (block 600). Some choices include an entire wafer, a quadrant of a wafer, and a partial wafer.

Various inserts are used to accommodate the quadrant of a wafer or the partial wafer (block 620).

Various spacers are used to accommodate a surface topography or non-uniform thickness (block 640).

Third, an upper retainer assembly is selected (block 700). Some choices include a peripheral ring, a discontinuous ring, a segmented ring, and clamps.

In an embodiment of the present invention, the lower support assembly 200 and the upper retainer assembly 400 of the thin-wafer handling system 10 are placed in a closed configuration by bringing the magnets 210 and the corresponding target plates 212 close enough to each other so that they attract each other strongly.

In an embodiment of the present invention, an adjustable dampening mechanism slows down a closing of the thin-wafer handling system 10. In an embodiment of the present invention, the dampening mechanism is hydrodynamic, such as with a viscoelastic fluid. In an embodiment of the present invention, the dampening mechanism is magnetic, such as with a high-magnetic permeability material.

In an embodiment of the present invention, a capacitive sensor detects a presence of the thin wafer 300 enclosed within the thin-wafer handling system 10.

In an embodiment of the present invention, an optical sensor detects alignment and orientation of the thin wafer 300.

In an embodiment of the present invention, the lower support assembly 200 and the upper retainer assembly 400 of the thin-wafer handling system 10 are placed in an opened configuration after a subsequent process step by separating the magnets 210 and the corresponding target plates 212 far enough apart so that they do not attract each other strongly.

In an embodiment of the present invention, the lower support assembly 200 and the upper retainer assembly 400 of the thin-wafer handling system 10 are completely detachable.

In an embodiment of the present invention, the lower support assembly 200 and the upper retainer assembly 400 of the thin-wafer handling system 10 are separable (but not detachable) by moving them apart vertically (in z-axis).

In an embodiment of the present invention, the lower support assembly 200 and the upper retainer assembly 400 of the thin-wafer handling system 10 are separable (but not detachable) by sliding them apart horizontally (in a plane of x-axis and y-axis).

In an embodiment of the present invention, the lower support assembly 200 and the upper retainer assembly 400 of the thin-wafer handling system 10 are separable (but not detachable) by pivoting sideways (on a vertical hinge) in a shearing motion horizontally (in the plane of x-axis and y-axis).

In an embodiment of the present invention, the lower support assembly 200 and the upper retainer assembly 400 of the thin-wafer handling system 10 are separable (but not detachable) by pivoting vertically (on a horizontal hinge) in a jaw-opening motion at an angle (out of the plane of x-axis and y-axis).

In an embodiment of the present invention, the thin wafer 300 is removed from the lower support assembly 200 and the upper retainer assembly 400 of the thin-wafer handling system 10 by increasing a circumference in a pincer-opening motion (in the plane of x-axis and y-axis).

In an embodiment of the present invention, the thin wafer 300 is removed from the thin-wafer handling system 10 once the lower support assembly 200 and the upper retainer assembly 400 of the thin-wafer handling system 10 are separated enough to provide an adequate clearance.

Fourth, a device is selected to open the thin wafer handling system (block 800). Some choices include a wedge, a piston, a cam, and an eccentric gear. In an embodiment of the present invention, perforations or openings are formed in the lower support assembly 200 or the upper retainer assembly 400 to operate the device. In an embodiment of the present invention, the device operates on a cantilever that is connected to the lower support assembly 200 or the upper retainer assembly 400.

In an embodiment of the present invention, the lower support assembly 200 and the upper retainer assembly 400 of the thin-wafer handling system 10 are separated by using an apparatus or a device, such as an effector or an actuator. In an embodiment of the present invention, the effector or actuator is mechanical, electromechanical, or optomechanical.

In an embodiment of the present invention, the lower support assembly 200 and the upper retainer assembly 400 of the thin-wafer handling system 10 are separated by using a wedge to pry them apart.

In an embodiment of the present invention, the lower support assembly 200 and the upper retainer assembly 400 of the thin-wafer handling system 10 are separated by using a piston to push or pull them apart.

In an embodiment of the present invention, the lower support assembly 200 and the upper retainer assembly 400 of the thin-wafer handling system 10 are separated by rotating a cam to push or pull them apart.

In an embodiment of the present invention, the lower support assembly 200 and the upper retainer assembly 400 of the thin-wafer handling system 10 are separated by rotating an eccentric gear to push or pull them apart.

Many embodiments and numerous details have been set forth above in order to provide a thorough understanding of the present invention. One skilled in the art will appreciate that many of the features in one embodiment are equally applicable to other embodiments. One skilled in the art will also appreciate the ability to make various equivalent substitutions for those specific materials, processes, dimensions, concentrations, etc. described herein. It is to be understood that the detailed description of the present invention should be taken as illustrative and not limiting, wherein the scope of the present invention should be determined by the claims that follow.

We claim:

1. A method comprising:
    providing a thin-wafer handling system including a lower support assembly having one of magnets and target plates, and an upper retainer assembly having the other of said magnets and target plates;
    separating said magnets and corresponding target plates, said corresponding target plates facing said magnets, by separating the lower support assembly from the upper retainer assembly of the thin-wafer handling system; and
    inserting or removing a thin semiconductor wafer from said thin-wafer handling system.

2. The method of claim 1 wherein said magnets comprise rare-earth magnets.

3. The method of claim 1 wherein said target plates comprise hard ferromagnetic material.

4. The method of claim 1 wherein said lower support assembly is formed from a rigid and tough material.

5. The method of claim 1 wherein said upper retainer assembly is formed from a light and flexible material.

6. The method of claim 1 wherein said thin wafer is formed from a circular and flat wafer by lapping and polishing a backside.

* * * * *